(12) United States Patent
Shirai

(10) Patent No.: US 6,417,558 B1
(45) Date of Patent: Jul. 9, 2002

(54) SEMICONDUCTOR DEVICE HAVING A REDUCED PARASITIC CAPACITANCE BONDING PAD STRUCTURE

(75) Inventor: Koji Shirai, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 35 days.

(21) Appl. No.: 09/606,147

(22) Filed: Jun. 29, 2000

(30) Foreign Application Priority Data

Jun. 30, 1999 (JP) .......................................... 11-186833

(51) Int. Cl.[7] .......................... H01L 27/01; H01L 29/00
(52) U.S. Cl. ..................... 257/532; 257/347; 257/350; 257/352
(58) Field of Search ................... 257/528, 532, 257/534, 535, 347, 352, 350, 784, 780, 781, 658

(56) References Cited

U.S. PATENT DOCUMENTS 5,691,556 A * 11/1997 Saito et al. ................. 257/532
5,773,868 A * 6/1998 Endo .......................... 257/347
6,265,755 B1 * 7/2001 Shinohara .................... 257/532

FOREIGN PATENT DOCUMENTS

| JP | 5-275628 | | 10/1993 |
| JP | 10-261671 | | 9/1998 |
| JP | 11-163357 | | 6/1999 |
| JP | 11-220133 | * | 8/1999 |

* cited by examiner

Primary Examiner—Minh Loan Tran
(74) Attorney, Agent, or Firm—Finnegan, Henderson, Farabow, Garrett & Dunner, L.L.P.

(57) ABSTRACT

There is provided a semiconductor device that has a reduced parasitic capacitance bonding pad structure using a silicon-on-insulator substrate. In the semiconductor device according to the present invention, a pn junction is formed by forming a semiconductor region, that has a different conductivity type from the active layer, in an active layer below a bonding pad to generate a depletion layer. Thus, a parasitic capacitance connected to the bonding pad can be reduced by a capacitance that is formed by the generation of this depletion layer. Also, a leakage current from the bonding pad can be suppressed by the generation of the pn junction.

22 Claims, 5 Drawing Sheets

$$C = \frac{C_{16} \cdot C_{12}}{C_{16} + C_{12}}$$

$$C' = \frac{C_{16} \cdot C_{D1} \cdot C_{12}}{C_{D1} \cdot C_{12} + C_{16} \cdot C_{12} + C_{16} \cdot C_{D1}}$$

$$C'' = \frac{C_{16} \cdot C_{D2} \cdot C_{D1} \cdot C_{12}}{C_{D2} \cdot C_{D1} \cdot C_{12} + C_{16} \cdot C_{D1} \cdot C_{12} + C_{16} \cdot C_{D2} \cdot C_{12} + C_{16} \cdot C_{D2} \cdot C_{D1}}$$

SEMICONDUCTOR DEVICE HAVING A REDUCED PARASITIC CAPACITANCE BONDING PAD STRUCTURE

CROSS REFERENCE TO RELATED APPLICATIONS

The subject application is related to subject matter disclosed in the Japanese Patent Application No. Hei 11-186833 filed in Jun. 30, 1999 in Japan, to which the subject application claims priority under the Paris Convention and which is incorporated by reference herein.

BACKGROUND OF THE INVENTION

1. Field of the Invention

The present invention relates generally to a semiconductor. device structure, and more specifically to a silicon-on-insulator semiconductor device having a reduced parasitic capacitance bonding pad structure.

2. Description of the Related Art

FIG. 1A is a cross-sectional view showing a semiconductor device having a conventional silicon-on-insulator (SOI) structure. A semiconductor device 100 in FIG. 1A adopts an SOI structure 102 that comprises a substrate 10, a buried oxide layer 12, and an active semiconductor layer (device layer) 14. A bonding pad 24, which is formed by opening a hole in a passivation layer 20, is arranged on this SOI structure 102. In the case of FIG. 1A, a capacitance C generated between the bonding pad 24 and the substrate 10 is represented by two series-connected capacitances. That is, as shown in FIG. 1B, the capacitance C between the bonding pad 24 and the substrate 10 consists of series-connected capacitances C16 and C12. The capacitance C16 is generated in a field insulating layer 16 as a capacitance insulating layer between the bonding pad 24 as an upper electrode and the active layer 14 as a lower electrode. The capacitance C12 is generated in the buried oxide layer 12 as the capacitance insulating layer between the active layer 14 as the upper electrode and the substrate 10 as the lower electrode. As apparent from FIG. 1B, the capacitance C can be represented by $$1/C = (1/C16) + (1/C12). \quad (1)$$

In other words, the capacitance C between the bonding pad 24 and the substrate 10 can be given by $$C = (C16 \cdot C12)/(C16 + C12). \quad (2)$$

However, the bonding pad formed on the SOI structure 102 in the prior art contains following problems. First, as described above, there is such a first problem is that the capacitance C represented by above Eq.(2) is generated between the bonding pad 24 and the substrate 10 in FIG. 1A, that is, the capacitance C is parasitically generated. When an electric signal is input from an external circuit (not shown) into various semiconductor devices (not shown) formed in the active layer 14 via the bonding pad 24, charge/discharge of the parasitic capacitance C connected to the bonding pad 24 is carried out simultaneously. Such charge/discharge of the parasitic capacitance C is repeated every time when the electric signal is input via the bonding pad 24. Therefore, a consumption power of the semiconductor integrated circuit (not shown) formed on the SOI structure 102 is caused to increase.

Also, when a wire such as a gold wire, etc. is connected to the bonding pad 24 by the bonding, a strong mechanical impact is applied to a field insulating layer 16 formed directly under the bonding pad 24. Therefore, there is also such a second problem that cracks are produced in the field insulating layer 16. The cracks act as current paths between the bonding pad 24 and the active layer 14. As a result, the cracks cause leakage currents to flow between a plurality of neighboring bonding pads 24 via the active layer 14.

In addition, there is such a third problem that an electric signal generated due to generation of the above leakage currents is transmitted to the substrate 10 via the capacitance C12 of the buried oxide layer 12 in FIG. 1B. This electric signal causes the electric interference in other bonding pads and other wirings except for the bonding pad 24 and the wiring 18 in FIG. 1A, or the semiconductor device in the active layer 14, etc. Then, malfunction of the semiconductor integrated circuit formed on the SOI structure 102 is caused due to such electric interference.

SUMMARY OF THE INVENTION

The present invention has been made to overcome such subjects, and it is an object of the present invention to provide a semiconductor device having a reduced parasitic capacitance bonding pad structure, capable of achieving reduced power consumption by reducing a parasitic capacitance.

It is another object of the present invention to provide a semiconductor device having a reduced parasitic capacitance bonding pad structure, capable of preventing malfunction of a semiconductor integrated circuit by suppressing a leakage current.

It is still another object of the present invention to provide a semiconductor device having a reduced parasitic capacitance bonding pad structure, capable of having high reliability for an impact effect in wire bonding.

In order to achieve the above object, according to a first aspect of the present invention, there is provided a semiconductor device having a silicon-on-insulator structure, comprising: a substrate; a first insulating layer (buried insulating layer) formed on the substrate; a first conductivity type semiconductor layer (active layer) formed on the buried insulating layer; a second insulating layer (field insulating layer) formed on the active layer; an electrode (bonding pad) formed on a part of the field insulating layer; and a semiconductor region within the semiconductor layer, the semiconductor region having a second conductivity type opposite the first conductivity type, and wherein the semiconductor region is positioned below the electrode. Here, either n-type or p-type may be selected as the first conductivity type. The second conductivity type is the p-type if the n-type is selected as the first conductivity type, otherwise the second conductivity type is the n-type if the p-type is selected as the first conductivity type. An SOI structure consisting of the substrate, the buried insulating layer, and the active layer may be formed by any one of the SIMOX method, a bonded-wafer method, and the epitaxial growth method.

Preferably, the semiconductor region should be brought into an electrically floating state, and a bottom portion of the semiconductor region should be apart by a predetermined distance from a top portion of the buried insulating layer not to directly contact. This is because, if the semiconductor region is electrically connected to other regions or comes into contact with the buried insulating layer, the leakage current is generated via the semiconductor region.

According to the first aspect of the present invention, the parasitic capacitance connected to the bonding pad can be reduced. Therefore, it is possible to reduce the capacitance that is charged/discharged every time when the electric signal is input/output via the bonding pad. As a result, consumption power of the semiconductor integrated circuit can be reduced.

Also, according to the first aspect of the present invention, the pn junction composed of the first conductivity type active layer and the second conductivity type semiconductor region is formed below the bonding pad. Therefore, even if the leakage current flows via the field insulating layer, diffusion of the leakage current can be prevented because of the presence of the pn junction.

In addition, the electric interference on other bonding pads, the devices, etc. can be reduced by reducing the above leakage current. Thus, the stable operation of the semiconductor integrated circuit can be achieved.

According to a second aspect of the present invention, the number of the semiconductor regions formed in the active layer is increased to two in the semiconductor device according to the above first aspect. That is, according to the second aspect of the present invention, there is provided a semiconductor device having a silicon-on-insulator structure, comprising: a substrate; a first insulating layer (buried insulating layer) formed on the substrate; a first conductivity type semiconductor layer (active layer) formed on the buried insulating layer; a second insulating layer (field insulating layer) formed on the active layer; an electrode (bonding pad) formed on a part of the field insulating layer; a first semiconductor region within the active layer, the first semiconductor region having a second conductivity type opposite the first conductivity type, and wherein the first semiconductor region is positioned below the bonding pad; and a second semiconductor region within the first semiconductor region, the second semiconductor region having a first conductivity type, and wherein the second semiconductor region is positioned below the bonding pad.

According to the second aspect of the present invention, the advantages obtained by the above first aspect becomes more and more remarkable.

In the first and second aspects of the present invention, if the semiconductor region formed in the active layer is extended along the path of the wiring on the field insulating layer, the capacitance generated under the wiring can be reduced simultaneously. As a result, the signal propagation over the wiring at the higher speed can be achieved.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1A:
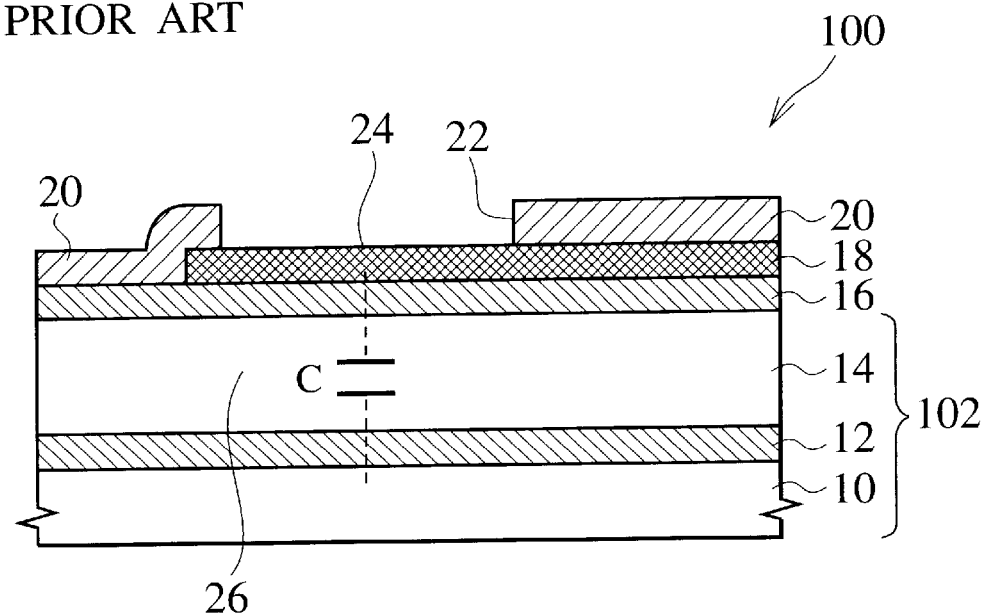
FIG. 1A is a cross-sectional view showing a bonding pad and its neighboring region of a semiconductor device having an SOI structure in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2A:
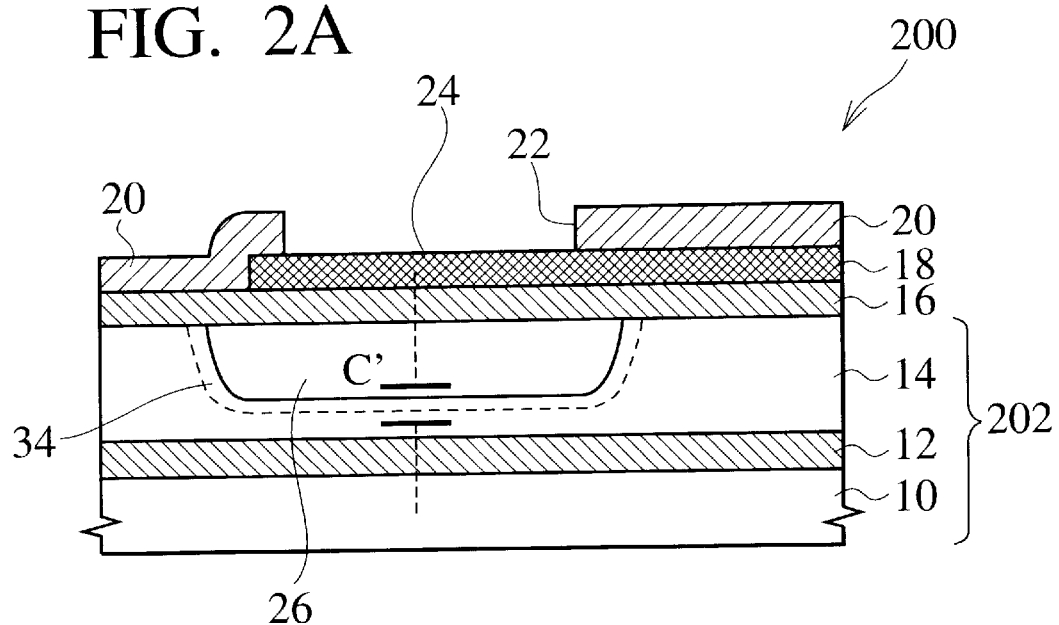
FIG. 2A is a cross-sectional view showing a bonding pad and its neighboring region of a semiconductor device having an SOI structure according to a first embodiment of the present invention.

FIG. 2A is a cross-sectional view showing a semiconductor device having a silicon-on-insulator (SOI) structure according to a first embodiment of the present invention. A semiconductor device 200 according to the first embodiment employs an SOI structure 202 in which a buried insulating layer 12, typically a buried oxide layer, is put between an n-type active semiconductor layer (device layer) 14 as an SOI layer and a p-type substrate (supporting substrate) 10. The p-type substrate 10 may, of course, be replaced with an n-type substrate. A p-type semiconductor region (p-type region) 26 is formed in the n-type active layer 14. A depletion layer 34 is formed in vicinity of an interface between the n-type active layer 14 and the p-type semiconductor region 26. Since this depletion layer 34 has a very high resistivity, it can be regarded as a kind of an insulator region. A capacitance of the depletion layer 34 that is an important portion of the present invention is changed by a depletion layer width. The depletion layer width is decided by both carrier densities of the n-type active layer 14 and the p-type semiconductor region 26. Then, if the carrier densities are largely different between the n-type active layer 14 and the p-type semiconductor region 26, the depletion layer width depends on the lower carrier density. Therefore, the capacitance of the depletion layer 34 can be changed by changing the carrier densities of the n-type active layer 14 and the p-type semiconductor region 26.

A field insulating layer 16 such as a silicon oxide layer is formed on the n-type active layer 14. A wiring 18 is arranged on the field insulating layer 16. Then, a passivation layer 20 is formed on the wiring 18. A part of the wiring 18 exposed from an opening 22 of the passivation layer 20 constitutes a bonding pad 24. Although omitted from a sectional view in FIG. 2A, actually the p-type semiconductor region 26 is formed to be positioned below the entire opening 22.

Figure 2B:
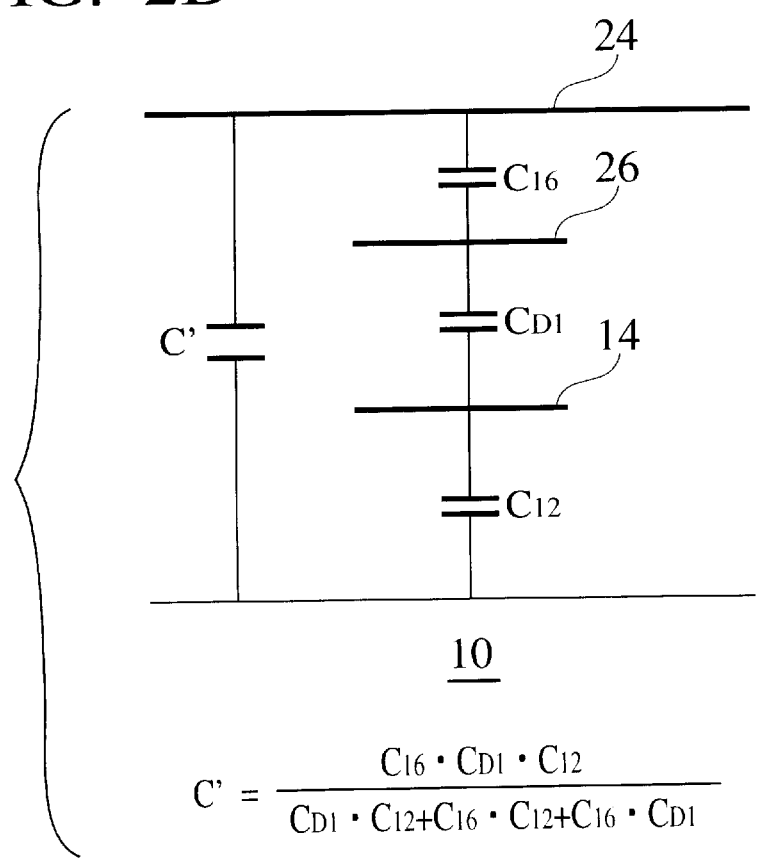
FIG. 2B is an equivalent circuit diagram showing a parasitic capacitance C' connected to the bonding pad in FIG. 2A.

FIG. 2B is an equivalent circuit diagram showing a parasitic capacitance C' generated directly under the bonding pad 24 in FIG. 2A. As shown in FIG. 2B, in the semiconductor device 200 according to the first embodiment of the present invention, the capacitance C' generated between the bonding pad 24 and the substrate 10 consists of series-connected capacitances C16, CD1, and C12. The capacitance C16 is generated in the field insulating layer 16 as a capacitance insulating layer between the bonding pad 24 as an upper electrode and the p-type semiconductor region 26 as a lower electrode. The capacitance CD1 is generated in the depletion layer 34 as the capacitance insulating layer between the p-type semiconductor region 26 as the upper electrode and the active layer 14 as the lower electrode. The capacitance C12 is generated in the buried oxide layer 12 as the capacitance insulating layer between the active layer 14 as the upper electrode and the substrate 10 as the lower electrode. As apparent from FIG. 2B, the parasitic capacitance C' can be represented by $$1/C'=(1/C16)+(1/CD1)+(1/C12). \quad (3)$$

In other words, the parasitic capacitance C' between the bonding pad 24 and the substrate 10 according to the first embodiment of the present invention can be given by $$C'=(C16 \cdot CD1 \cdot C12)/(CD1 \cdot C12+C16 \cdot C12+C16 \cdot CD1). \quad (4)$$

Figure 1B:
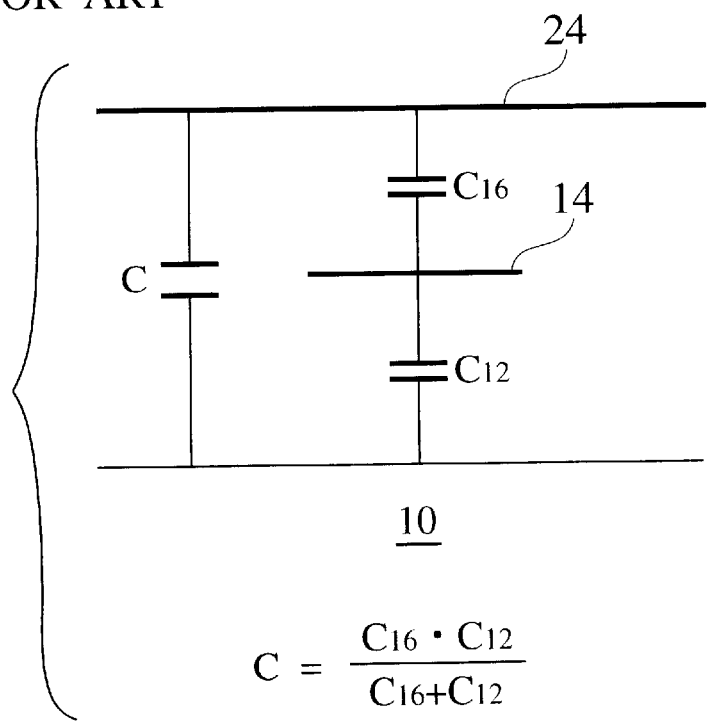
FIG. 1B is an equivalent circuit diagram showing a parasitic capacitance C connected to the bonding pad in FIG. 1A.

Here, assume that, in FIG. 1B and FIG. 2B, the capacitances C16, CD1, and C12 are selected to satisfy C16=CD1=C12=c. Under this assumption, a value of the parasitic capacitance C of the semiconductor device given by above Eq.(2) in the prior art becomes c/2. In contrast, a value of the parasitic capacitance C' of the semiconductor device given by above Eq.(4) according to the first embodiment of the present invention becomes c/3. According to the first embodiment of the present invention, as is apparent from c/2>c/3, the value of the parasitic capacitance C' generated between the bonding pad 24 and the substrate 10 can be reduced largely rather than the prior art, because of the presence of the depletion layer 34 shown in FIG. 2A.

Next, experimental data about to the reduced parasitic capacitance bonding pad structure according to the first embodiment of the present invention to check the above effect will be discussed hereunder. Conditions for forming the semiconductor device employed in this experiment will be given in the following.

The substrate 10 in FIG. 2A is a p-type semiconductor substrate that has a carrier density of $1\times10^{15}$ cm$^{-3}$ and a layer thickness of more than 100 $\mu$m; the buried oxide layer 12 has a layer thickness of 1 $\mu$m; the n-type active layer 14 has a carrier density of $1\times10^{15}$ cm$^{-3}$ and a layer thickness of more than 10 $\mu$m; the p-type semiconductor region 26 has a carrier density of $1\times10^{16}$ cm$^{-3}$ and a depth of 5 $\mu$m; the field insulating layer 16 has a layer thickness of 1 $\mu$m; and the wiring 18 is an Al wiring. Also, as a comparative example, the semiconductor device is formed under the same conditions except that the p-type semiconductor region 26 is not provided. According to this experiment, such an effect can be achieved that the parasitic capacitance C' according to the first embodiment of the present invention can be reduced by almost 15% rather than the parasitic capacitance C in the prior art in which the p-type semiconductor region 26 is not provided.

As described above, according to the bonding pad structure of the first embodiment of the present invention, the parasitic capacitance C' generated between the bonding pad 24 and the substrate 10 can be reduced. Therefore, the parasitic capacitance which is charged/discharged every time when an electric signal is input from an external device to the bonding pad 24 is reduced, and thus reduction in power consumption of the semiconductor integrated circuit can be achieved.

In addition, even if cracks are caused in the field insulating layer 16 by the impact upon the wire bonding, the leakage current flowing in the n-type active layer 14 via the cracks can be blocked because of the presence of pn junction composed of the p-type semiconductor region 26 and the n-type active layer 14. Furthermore, the electric interference on other bonding pads 24, etc. can be suppressed by reducing the leakage current, and thus reliability of the semiconductor integrated circuit can be improved.

In the first embodiment of the present invention, the p-type semiconductor region 26 as the important portion of the present invention is set in a floating state and also a depth of the p-type semiconductor region 26 must be decided such that a bottom portion of the p-type semiconductor region 26 does not reach a top surface of the buried oxide layer 12. For the flow of the leakage current via the p-type semiconductor region 26 is brought about if the p-type semiconductor region 26 is connected electrically to other regions or comes into contact with the buried oxide layer 12. The p-type semiconductor region 26 may be formed by the dedicated photolithography step, the dedicated ion implantation step, and the dedicated diffusion step. For instance, the p-type semiconductor region 26 may be formed by using the p-type well forming step applied to the transistor region.

Second Embodiment

Figure 3A:
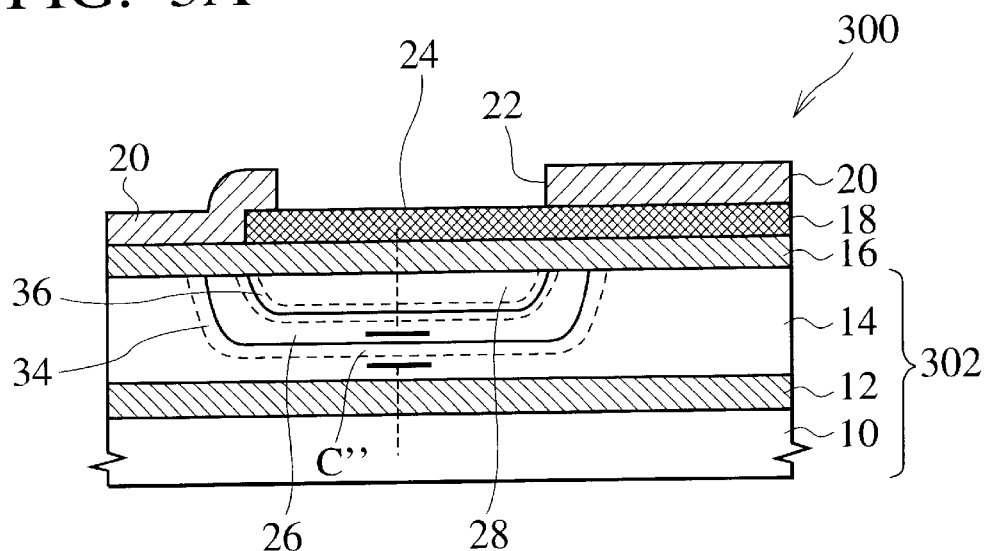
FIG. 3A is a cross-sectional view showing a bonding pad and its neighboring region of a semiconductor device having an SOI structure according to a second embodiment of the present invention.

Next, a second embodiment of the present invention will be explained hereunder. FIG. 3A is a cross-sectional view showing a semiconductor device having an SOI structure according to a second embodiment of the present invention. A semiconductor device 300 according to the second embodiment is similar to the above first embodiment in that an SOI structure 303 in which the buried insulating layer 12 is put between the n-type active layer 14 and the substrate 10 is employed and that the p-type semiconductor region 26 is formed in the n-type active layer 14.

In the second embodiment of the present invention, further an n-type semiconductor region (n-type region) 28 is formed in the p-type semiconductor region 26, and a second depletion layer 36 is formed in vicinity of an interface between the p-type semiconductor region 26 and the n-type semiconductor region 28. This second depletion layer 36 has a similar function to the first depletion layer 34 that is formed in vicinity of the interface between the n-type active layer 14 and the p-type semiconductor region 26, and has a depletion layer capacitance that is varied by the depletion layer width.

Figure 3B:
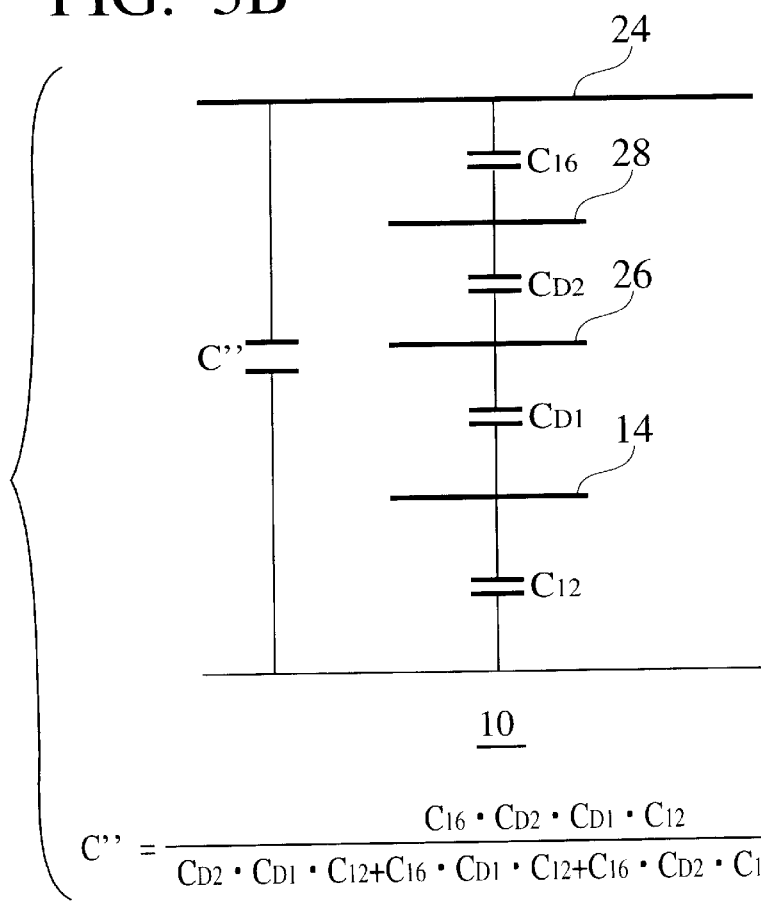
FIG. 3B is an equivalent circuit diagram showing a parasitic capacitance C" connected to the bonding pad in FIG. 3A.

FIG. 3B is an equivalent circuit diagram showing a parasitic capacitance C'' generated immediately under the bonding pad 24 in FIG. 3A. As shown in FIG. 3B, in the semiconductor device 300 according to the second embodiment of the present invention, the parasitic capacitance C'' generated between the bonding pad 24 and the substrate 10 consists of series-connected capacitances C16, CD2, CD1, and C12. The capacitance C16 is generated in the field insulating layer 16 as the capacitance insulating layer between the bonding pad 24 as an upper electrode and the n-type semiconductor region 28 as the lower electrode. The capacitance CD2 is generated in the second depletion layer 36 as the capacitance insulating layer between the n-type semiconductor region 28 as the upper electrode and the p-type semiconductor region 26 as the lower electrode. The capacitance CD1 is generated in the first depletion layer 34 as the capacitance insulating layer between the p-type semiconductor region 26 as the upper electrode and the active layer 14 as the lower electrode. The capacitance C12 is generated in the buried oxide layer 12 as the capacitance insulating layer between the active layer 14 as the upper electrode and the substrate 10 as the lower electrode. As apparent from FIG. 3B, the parasitic capacitance C' can be represented by $$1/C''=(1/C16)+(1/CD2)+(1/CD1)+(1/C12). \quad (5)$$

In other words, the parasitic capacitance C'' between the bonding pad 24 and the substrate 10 according to the second embodiment of the present invention can be given by $$C''=(C16 \cdot CD2 \cdot CD1 \cdot C12)/(CD2 \cdot CD1 \cdot C12+C16 \cdot CD1 \cdot C12+C16 \cdot CD2 \cdot C12+C16 \cdot CD2 \cdot CD1). \quad (6)$$

Here, assume that, in FIG. 1B and FIG. 3B, the capacitances C16, CD2, CD1 and C12 are selected to satisfy C16=CD2=CD1=C12=c. Under this assumption, a value of the parasitic capacitance C of the semiconductor device given by above Eq.(2) in the prior art becomes c/2. In contrast, a value of the parasitic capacitance C''of the semiconductor device given by above Eq.(6) according to the second embodiment of the present invention becomes c/4. According to the second embodiment of the present invention, as is apparent from c/2>c/4, the value of the parasitic capacitance C' generated between the bonding pad 24 and the substrate 10 can be reduced largely rather than the first embodiment, because of the presence of the first and second depletion layers 34, 36 shown in FIG. 3A.

In the second embodiment of the present invention, like the above first embodiment, the n-type semiconductor region 28 as the important portion of the present invention is set in a floating state and also a depth of the n-type semiconductor region 28 must be decided such that a bottom portion of the n-type semiconductor region 28 does not reach a top surface of the p-type semiconductor region 26. Like the p-type semiconductor region 26, the n-type semiconductor region 28 may be formed by the dedicated photolithography step, the dedicated ion implantation step, and the dedicated diffusion step. For example, the n-type semiconductor region 28 may be formed by using the channel stopper forming step applied to the transistor region. This channel stopper is formed to prevent the formation of the parasitic transistor by increasing the carrier density under the field oxide layer.

According to the second embodiment of the present invention, the same advantages as the first embodiment can be achieved.

Other Embodiment

Figure 4:
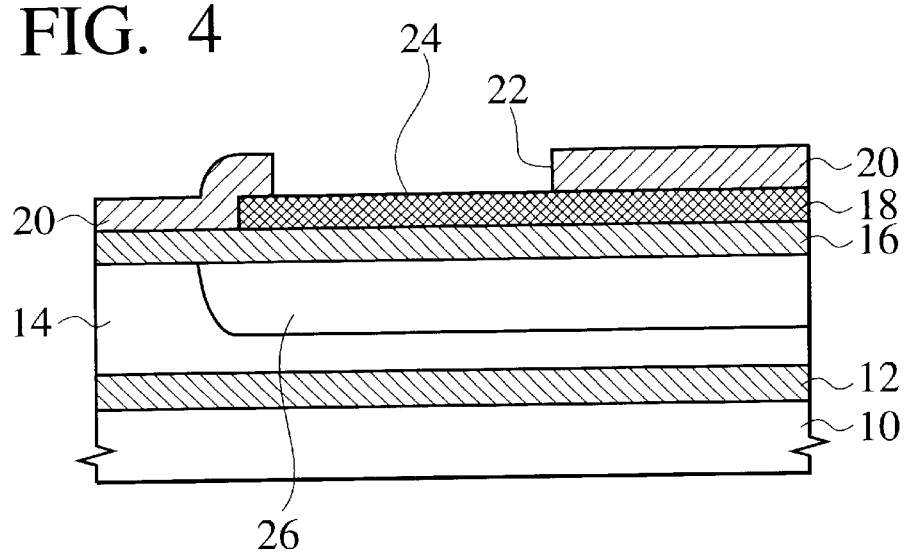
FIG. 4 is a cross-sectional view showing a bonding pad and its neighboring region of a semiconductor device having an SOI structure according to other embodiment of the present invention.

For example, as shown in FIG. 4, the p-type semiconductor region 26 in the above first and second embodiments may be extended below the wiring 18 along the wiring path to exceed a region underneath the bonding pad 24. Accordingly, reduction in the parasitic capacitance under the wiring 18 as well as the above reduction in the parasitic capacitance under the bonding pad 24 can be attained. Therefore, a propagation speed of a signal transmitted over the wiring 18 can be accelerated.

Figure 5:
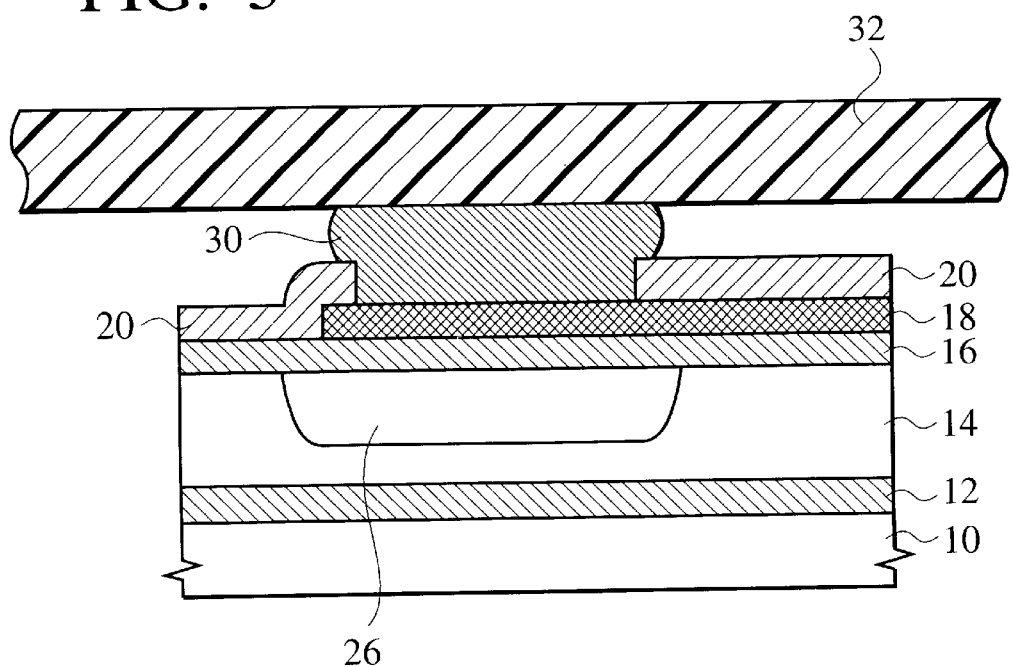
FIG. 5 is a view showing a situation that the bonding pad of the semiconductor device according to the present invention is pressure-bonded to a printed board via a conductive bump.

In the first and second embodiments, the case where the wire is bonded to the bonding pad 24 by virtue of the wire bonding has been explained. However, as shown in FIG. 5, even if the bonding pad is pressure-bonded to a printed board via various conductive connectors such as a conductive ball, a conductive bump 30, etc., the similar advantages to the above can be achieved.

One semiconductor region 26 is formed in the active layer 14 in the first embodiment, whereas two semiconductor regions 26, 28 are formed in the active layer 14 in the second embodiment. However, in the present invention, the number of the semiconductor regions formed in the active layer 14 is not limited the above.

For example, in the second embodiment shown in FIG. 3A, a second p-type semiconductor region may be formed in the n-type semiconductor region 28. In addition, a second n-type semiconductor region may be formed in this second p-type semiconductor region. Also, a plurality of p-type and n-type semiconductor regions are formed alternatively in the similar way. In this case, bottom portions of the plurality of p-type and n-type semiconductor regions are formed not to contact with bottom portions of the closest external semiconductor region respectively. Further, all semiconductor regions are brought into the electrically floating state. According to the above structure, the above advantages obtained in the first and second embodiments can become more and more conspicuous.

In the first and second embodiments, SOI structures such as SOI structure 202 of FIG. 2A are fabricated mainly by SIMOX (Separation by Implanted Oxygen) or by bonded-wafer methods.

Figure 6A:
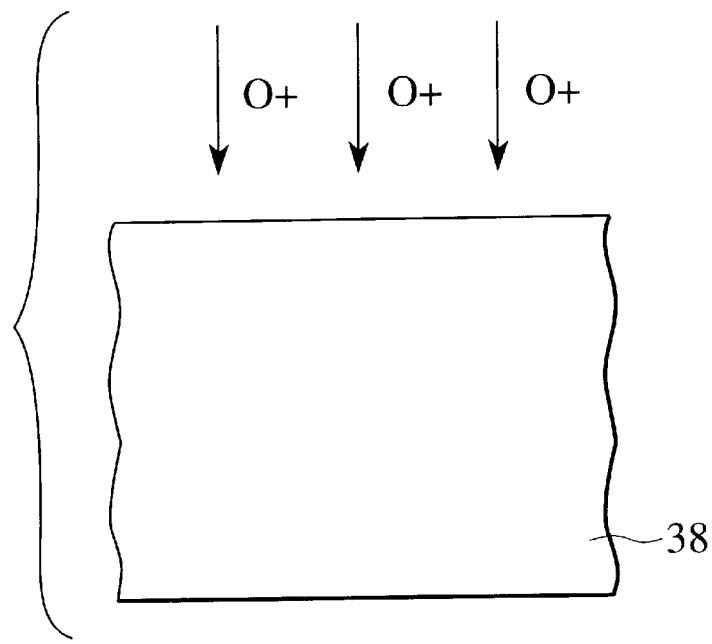
FIG. 6A is a cross-sectional view showing the SIMOX process.

FIG. 6A is a cross-sectional view showing a conventional SIMOX process. In a conventional SIMOX process, buried oxide layer 12 (see FIG. 2A) is created by implanting oxygen ($O^+$) ions into a bulk silicon substrate 38, as illustrated in FIG. 6A. Implantation energies and doses are well established in the SIMOX process. In this manner, the $O^+$ ions penetrate sufficiently deeply at a high enough concentration into bulk silicon substrate 38 to form the buried oxide layer 12, as shown in SOI structure 202 of FIG. 2A. In accordance with conventional integrated circuit technology, greater implantation energies produce greater implant depths and thus greater thicknesses of the active semiconductor layer 14 of FIG. 2A. To achieve other implant depths and concentrations, other appropriate implantation energies and doses can be applied.

Figure 6B:
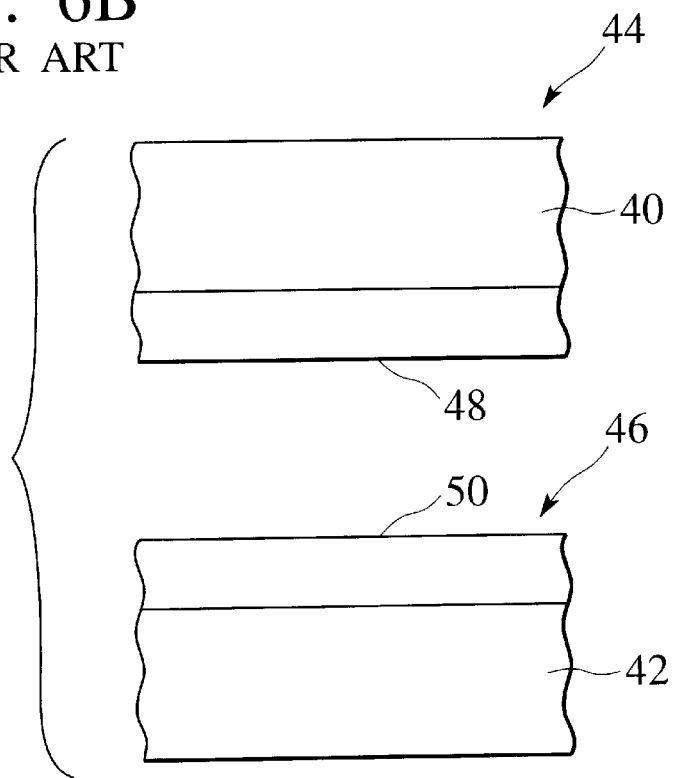
FIG. 6B is a cross-sectional view showing the bonded-wafer process.

FIG. 6B is a cross-sectional view showing the bonded-wafer process. In the bonded-wafer process, typically two bulk silicon wafer substrates 40 and 42 are oxidized using conventional methods, forming oxidized wafer structures 44 and 46 respectively, having respective oxide surfaces 48 and 50. Oxide surfaces 48 and 50 and then contacted together, and oxidized wafer structures 44 and 46 are fused together in a high-temperature furnace (not shown), forming a conventional SOI structure 202, as shown in FIG. 2A.

Various modifications will become possible for those skilled in the art after receiving the teachings of the present disclosure without departing from the scope thereof

What is claimed is:

1. A semiconductor device having a silicon-on-insulator structure, comprising:
   (c) a first conductivity type semiconductor layer disposed on the first insulating layer;
   (d) a second insulating layer disposed on the semiconductor layer;
   (e) an electrode disposed on a part of the second insulating layer; and
   (f) a semiconductor region within the semiconductor layer, brought into an electrically floating state, having a second conductivity type opposite the first conductivity type, and positioned below the electrode.

2. A semiconductor device according to claim 1, wherein a depletion layer is formed in vicinity of an interface between the semiconductor layer and the semiconductor region.

3. A semiconductor device according to claim 1, wherein the semiconductor region is brought into an electrically floating state, and
   a bottom portion of the semiconductor region is apart from a top portion of the first insulating layer.

4. A semiconductor device according to claim 1, wherein a top portion of the semiconductor region comes directly into contact with the second insulating layer.

5. A semiconductor device according to claim 1, further comprising:
   a passivation layer disposed to cover a remaining portion of the second insulating layer and a part of the electrode.

6. A semiconductor device according to claim 5, wherein the electrode is constituted by a part of a wiring disposed selectively on the second insulating layer, and an opening portion formed in the passivation layer to expose a part of the wiring.

7. A semiconductor device according to claim 6, wherein the semiconductor region extends from an area below the electrode along a path of the wiring.

8. A semiconductor device according to claim 1, wherein the first conductivity is n-type.

9. A semiconductor device according to claim 1, wherein the first conductivity is p-type.

10. A semiconductor device according to claim 1, wherein at least one semiconductor element is disposed in the semiconductor layer.

11. A semiconductor device having a silicon-on-insulator structure, comprising:
   (a) a substrate;
   (b) a first insulating layer disposed on the substrate;
   (c) a first conductivity type semiconductor layer disposed on the first insulating layer;
   (d) a second insulating layer disposed on the semiconductor layer;
   (e) an electrode disposed on a part of the second insulating layer;
   (f) a first semiconductor region within the semiconductor layer, brought into an electrically floating state, having a second conductivity type opposite the first conductivity type, and positioned below the electrode; and
   (g) a second semiconductor region within the first semiconductor region, brought into an electrically floating state, having a first conductivity type, and positioned below the electrode.

12. A semiconductor device according to claim 11, wherein depletion layers are formed in vicinity of an interface between the semiconductor layer and the first semiconductor region and in vicinity of an interface between the first semiconductor region and the second semiconductor region respectively.

13. A semiconductor device according to claim 11, wherein top portions of the first and second semiconductor regions come directly into contact with the second insulating layer.

14. A semiconductor device according to claim 11, further comprising:
   a passivation layer formed to cover a remaining portion of the second insulating layer and a part of the electrode.

15. A semiconductor device according to claim 14, wherein the electrode is constituted by a part of a wiring formed selectively on the second insulating layer, and an opening portion formed in the passivation layer to expose a part of the wiring.

16. A semiconductor device according to claim 11, wherein the first conductivity is n-type.

17. A semiconductor device according to claim 11, wherein the first conductivity is p-type.

18. A semiconductor device according to claim 11, wherein at least one semiconductor element is disposed in the semiconductor layer.

19. A semiconductor device having a silicon-on-insulator structure, comprising:
   (a) a substrate;
   (b) a first insulating layer disposed on the substrate;
   (c) a first conductivity type semiconductor layer disposed on the first insulating layer;
   (d) a second insulating layer disposed on the semiconductor layer;
   (e) an electrode disposed on a part of the second insulating layer;
   (f) a first semiconductor region within the semiconductor layer, the first semiconductor region brought into an electrically floating state, having a second conductivity type opposite the first conductivity type, and wherein the first semiconductor region is positioned below the electrode and wherein a bottom portion of the first semiconductor region is apart from a top portion of the first insulating layer; and
   (g) a second semiconductor region within the first semiconductor region, the second semiconductor region brought into an electrically floating state, and having a first conductivity type, and wherein the second semiconductor region is positioned below the electrode and wherein a bottom portion of the second semiconductor region is apart from a bottom portion of the first semiconductor region.

20. A semiconductor device having a silicon-on-insulator structure, comprising:
   (a) substrate;
   (b) a first insulating layer disposed on the substrate;
   (c) a first conductivity type semiconductor layer disposed on the first insulating layer;
   (d) a second insulating layer disposed on the semiconductor layer;
   (e) an electrode disposed on a part of the second insulating layer and constituted by a part of a wiring formed selectively on a part of the second insulating layer;
   (f) a first semiconductor region within the semiconductor layer, the first semiconductor region having a second conductivity type opposite the first conductivity type, and wherein the first semiconductor region is positioned below the electrode, and extending from an area below the electrode along a path of the wiring;
   (g) a second semiconductor region within the first semiconductor region, the second semiconductor region having a fist conductivity type, and wherein the second region is positioned below the electrode, and extending from an area below the electrode along a path of the wiring; and
   (h) a passivation layer formed to cover a remaining portion of the second insulating layer and a part of the electrode, and having an opening portion to expose the part of the wiring.

21. A semiconductor device having a silicon-on-insulator structure, comprising:
  (a) a substrate;
  (b) a first insulating layer disposed on the substrate;
  (c) a first conductivity type semiconductor layer disposed on the first insulating layer;
  (d) a second insulating layer disposed on the semiconductor layer;
  (e) an electrode disposed on a part of the second insulating layer;
  (f) a first semiconductor region within the semiconductor layer, brought into an electrically floating state, and having a second conductivity type opposite the first conductivity type, and positioned below the electrode; and
  (g) a second semiconductor region within the first semiconductor region, having a first conductivity type, and positioned below the electrode.

22. A semiconductor device having a silicon-on-insulator structure, comprising:
  (a) substrate;
  (b) a first insulating layer disposed on the substrate;
  (c) a first conductivity type semiconductor layer disposed on the first insulating layer;
  (d) a second insulating layer disposed on the semiconductor layer;
  (e) an electrode disposed on a part of the second insulating layer;
  (f) a first semiconductor region within the semiconductor layer, having a second conductivity type opposite the first conductivity type, and positioned below the electrode; and
  (g) a second semiconductor region within the first semiconductor region, brought into an electrically floating state, and having a first conductivity type, and positioned below the electrode.

* * * * *